US012748957B2

(12) United States Patent
King et al.

(10) Patent No.: US 12,748,957 B2
(45) Date of Patent: Sep. 29, 2026

(54) NEURAL NETWORK SYSTEM, HIGH DENSITY EMBEDDED-ARTIFICIAL SYNAPTIC ELEMENT AND OPERATING METHOD THEREOF

(71) Applicant: NATIONAL TSING HUA UNIVERSITY, Hsinchu (TW)

(72) Inventors: Ya-Chin King, Hsinchu (TW); Hsin-Yuan Yu, Hsinchu (TW); Chrong-Jung Lin, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 1079 days.

(21) Appl. No.: 17/813,598

(22) Filed: Jul. 19, 2022

(65) Prior Publication Data

US 2023/0289577 A1 Sep. 14, 2023

(30) Foreign Application Priority Data

Mar. 9, 2022 (TW) ................................. 111108464

(51) Int. Cl.
*G06N 3/063* (2023.01)
*G11C 11/54* (2006.01)
(Continued)

(52) U.S. Cl.
CPC .............. *G06N 3/063* (2013.01); *G11C 11/54* (2013.01); *G11C 13/004* (2013.01);
(Continued)

(58) Field of Classification Search
CPC ... G11C 11/54; G11C 13/003; G11C 2213/79; H10B 63/30
See application file for complete search history.

(56) References Cited

U.S. PATENT DOCUMENTS 9,514,818 B1 12/2016 Roizin et al.
9,805,770 B1 * 10/2017 Merced Grafals ....... G11C 7/00
(Continued)

FOREIGN PATENT DOCUMENTS

| | | |
|---|---|---|
| TW | 201214307 A | 4/2012 |
| TW | I728556 B | 5/2021 |
| TW | I753532 B | 1/2022 |

OTHER PUBLICATIONS

Hsin Yuan Yu, "HKMG CMOS embedded Artificial Synaptic Device (eASD) for High Speed Neuromorphic Computing Chip", Graduation Thesis Oral Defense for Master's Degree of Department of Institute of Electronics Engineering, National Tsing Hua University, dated on Jul. 22, 2021, oral presentation, Taiwan, R.O.C.

*Primary Examiner* — Mushfique Siddique
(74) *Attorney, Agent, or Firm* — CKC & Partners Co., LLC

(57) ABSTRACT

A high density embedded-artificial synaptic element includes a semiconductor substrate, a select transistor, a metal layer and a memory transistor. The select transistor is disposed on the semiconductor substrate and includes a first gate structure, a drain region and a source region. The drain region and the source region are located on the opposite sides of the first gate structure. The metal layer is connected to the drain region. The memory transistor is disposed on the semiconductor substrate and includes a second gate structure, a first electrode region, a second electrode region, a first memristor and a second memristor. The second gate structure is connected to the metal layer. The first memristor is formed between the second gate structure and the first electrode region. The second memristor is formed between the second gate structure and the second electrode region.

5 Claims, 12 Drawing Sheets

100

(51) Int. Cl.
*G11C 13/00* (2006.01)
*H10B 63/00* (2023.01)
*H10N 70/20* (2023.01)

(52) U.S. Cl.
CPC ......... *G11C 13/0069* (2013.01); *H10B 63/30* (2023.02); *H10N 70/24* (2023.02); *H10N 70/253* (2023.02); *G11C 13/0007* (2013.01); *G11C 13/003* (2013.01); *G11C 2213/79* (2013.01)

(56) References Cited

U.S. PATENT DOCUMENTS

| | | | | |
|---|---|---|---|---|
| 9,847,132 | B1 * | 12/2017 | Zheng | G11C 13/0069 |
| 10,847,224 | B1 * | 11/2020 | Li | G11C 13/004 |
| 2016/0093398 | A1 * | 3/2016 | Choi | G11C 17/165 365/100 |
| 2017/0221558 | A1 * | 8/2017 | Hu | G11C 13/0061 |
| 2018/0159536 | A1 | 6/2018 | Swartzlander et al. | |
| 2019/0156208 | A1 | 5/2019 | Park et al. | |
| 2021/0125663 | A1 | 4/2021 | Chang et al. | |
| 2021/0257405 | A1 | 8/2021 | Lesso | |
| 2022/0068378 | A1 * | 3/2022 | Chih | H10B 63/30 |
| 2023/0223089 | A1 * | 7/2023 | Lin | G11C 7/24 365/185.17 |
| 2023/0292533 | A1 * | 9/2023 | King | G11C 13/003 |

* cited by examiner

800

NEURAL NETWORK SYSTEM, HIGH DENSITY EMBEDDED-ARTIFICIAL SYNAPTIC ELEMENT AND OPERATING METHOD THEREOF

RELATED APPLICATIONS

This application claims priority to Taiwan Application Serial Number 111108464, filed Mar. 9, 2022, which is herein incorporated by reference.

BACKGROUND

Technical Field

The present disclosure relates to a high density embedded-artificial synaptic element and an operating method thereof. More particularly, the present disclosure relates to a high density embedded-artificial synaptic element based on a pair of complementary memristors and an operating method thereof, which are applied to a neural network system with high-speed computing and low-power consumption.

Description of Related Art

Applications of the Resistive Random-Access Memory (RRAM) have been widely investigated to solve the reliability issues in traditional computing units such as high-power consumption and low transmission efficiency. RRAM, also known as Memristor, which meets the requirements for data storage in the Internet of Things (IoT) era. Memristors have the effects of low-power consumption, high durability and high unit density, and are indispensable memory components for the Computing In Memory (CIM) and the Neural Network (NN) systems. On the other hand, the NN reveals advantages in visual recognition and large-scale automatic system. Hence, combined NN with RRAM have shown great potential.

There are many structures that integrating the memory with the CIM and NN of the smart system today to further improve the computing power and the efficiency. Although memristors are one of the possible solutions for the next generation Von Neumann computing architectures, the logic gates of the memristors are not compatible with Complementary Metal-Oxide-Semiconductor (CMOS) logic circuits. In addition, the construction and training of the synaptic elements in the NN are mostly based on the mathematical models, which reflect the changes in the weights through the machine learning and algorithms, and input the training results into the functional model for verification. The lack of detailed representation of the silicon data makes the construction, training and validation of the synaptic elements difficult to apply to other models, and leads to standard inconsistencies in the accuracy applied to recognition and deep learning.

SUMMARY

According to one aspect of the present disclosure, a high density embedded-artificial synaptic element includes a semiconductor substrate, a select transistor, a metal layer and a memory transistor. The select transistor is disposed on the semiconductor substrate and includes a first gate structure, a drain region and a source region. The drain region and the source region are located on two opposite sides of the first gate structure, respectively. The metal layer is electrically connected to the drain region of the select transistor. The memory transistor is disposed on the semiconductor substrate and coplanar with the select transistor. The memory transistor includes a second gate structure, a first electrode region, a second electrode region, a first memristor and a second memristor. The second gate structure is electrically connected to the metal layer. The first memristor is formed between the second gate structure and the first electrode region. The second memristor is formed between the second gate structure and the second electrode region.

According to another aspect of the present disclosure, an operating method of a high density embedded-artificial synaptic element is provided. The high density embedded-artificial synaptic element includes a select transistor, a metal layer and a memory transistor. The memory transistor includes a first electrode region, a second electrode region, a first memristor and a second memristor. The operating method of the high density embedded-artificial synaptic element includes performing a setting step, a writing step and a reading step. The setting step is performed to apply an initial voltage to the first electrode region and the second electrode region to set the first memristor and the second memristor in a low resistive state. The writing step is performed to apply a write voltage to one of the first electrode region and the second electrode region to reset one of the first memristor and the second memristor to a high resistive state. The first memristor and the second memristor correspond to a write bit. The reading step is performed to float a gate electrode of the select transistor, apply a read voltage to the first electrode region, and apply another read voltage to the second electrode region. An output voltage of the metal layer is determined according to the write bit.

According to yet another aspect of the present disclosure, a neural network system includes a plurality of the high density embedded-artificial synaptic elements of the aforementioned aspect and a plurality of diodes. The high density embedded-artificial synaptic elements are arranged in array. The metal layer of each of the high density embedded-artificial synaptic elements generates an output voltage. The first gate structure of the select transistor of each of the high density embedded-artificial synaptic elements arranged in column is coupled to a word line. The source region of the select transistor of each of the high density embedded-artificial synaptic elements arranged in row is coupled to a bit line. The first electrode region of the memory transistor of each of the high density embedded-artificial synaptic elements arranged in row is coupled to a first electrode line. The second electrode region of the memory transistor of each of the high density embedded-artificial synaptic elements arranged in row is coupled to a second electrode line. Each of the diodes is coupled to the two metal layers of each two of the high density embedded-artificial synaptic elements adjacent to each other in a vertical direction. Each of the diodes has an anode end, and the anode ends of the diodes arranged in row are connected to each other and gather an output current. Each of the diodes determines whether to conduct or not according to the two output voltages of the two metal layers of each two of the high density embedded-artificial synaptic elements adjacent to each other in the vertical direction.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
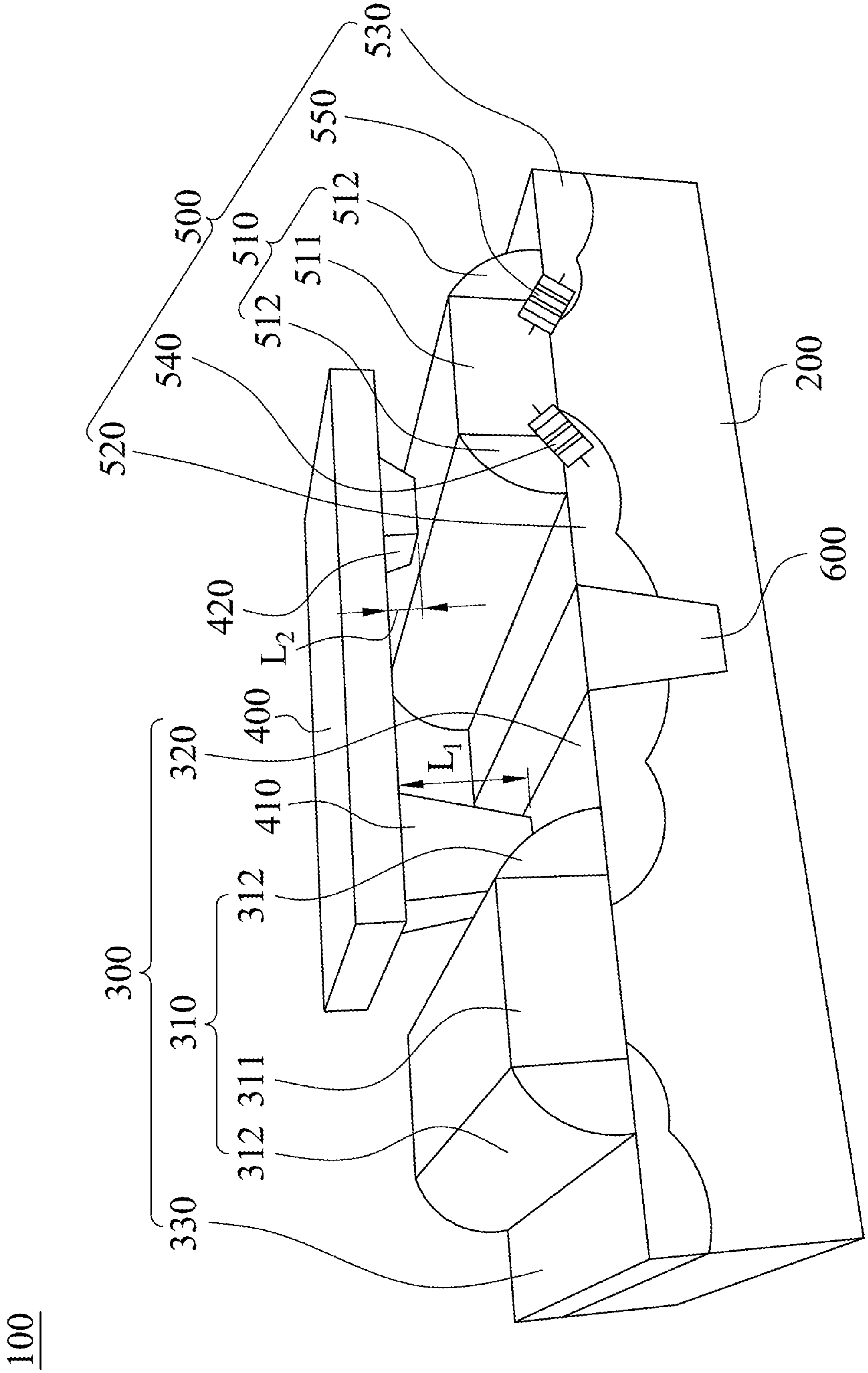
FIG. 1 shows a three-dimensional schematic view of a high density embedded-artificial synaptic element according to a first embodiment of the present disclosure.
Figure 2:
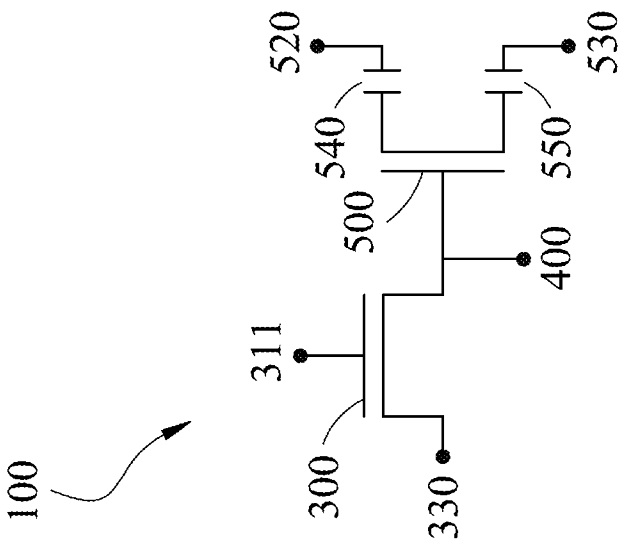
FIG. 2 shows an equivalent circuit diagram of the high density embedded-artificial synaptic element of FIG. 1.

Please refer to FIGS. 1 and 2. FIG. 1 shows a three-dimensional schematic view of a high density embedded-artificial synaptic element 100 according to a first embodiment of the present disclosure. FIG. 2 shows an equivalent circuit diagram of the high density embedded-artificial synaptic element 100 of FIG. 1. As shown in FIGS. 1 and 2, the high density embedded-artificial synaptic element 100 includes a semiconductor substrate 200, a select transistor 300, a metal layer 400 and a memory transistor 500.

The select transistor 300 is disposed on the semiconductor substrate 200 and includes a first gate structure 310, a drain region 320 and a source region 330. The drain region 320 and the source region 330 are located on two opposite sides of the first gate structure 310, respectively. The metal layer 400 is electrically connected to the drain region 320 of the select transistor 300. The memory transistor 500 is disposed on the semiconductor substrate 200 and coplanar with the select transistor 300. The memory transistor 500 includes a second gate structure 510, a first electrode region 520, a second electrode region 530, a first memristor 540 and a second memristor 550. The second gate structure 510 is electrically connected to the metal layer 400. The first electrode region 520 and the second electrode region 530 are located on two opposite sides of the second gate structure 510, respectively. The first memristor 540 is formed between the second gate structure 510 and the first electrode region 520. The second memristor 550 is formed between the second gate structure 510 and the second electrode region 530. Therefore, the high density embedded-artificial synaptic element 100 of the present disclosure utilizes the metal layer 400 to connect the drain region 320 of the select transistor 300 to the second gate structure 510 of the memory transistor 500, besides it can utilize the characteristics of the complementary resistive states of the first memristor 540 and the second memristor 550 in the memory transistor 500 to operate the twin bits in a high resistive state and a low resistive state, respectively, and form a structure of a Non-Volatile Memory Latch (NVM Latch). Therefore, the data output characteristic of the high density embedded-artificial synaptic element 100 is more stable and higher efficient than the analogy access used by the conventional logic gates. Compared with other prior synaptic elements, the high density embedded-artificial synaptic element 100 of the present disclosure can achieve the data density of the twin bits on a single transistor (i.e., the memory transistor 500), which is more in line with the high data density requirements of the Computing In Memory (CIM).

In the first embodiment, the semiconductor substrate 200 can include elementary semiconductor materials, compound semiconductor materials, and/or alloy semiconductor materials. The elementary semiconductor materials are, for example, crystal silicon, polycrystalline silicon, amorphous silicon, germanium, and/or diamond. In addition, the select transistor 300 can be a High-K Metal Gate (HKMG) N-type field effect transistor with a 28 nanometer (28 nm) process, and the memory transistor 500 can be a N-type field effect transistor with the 28 nm process, but the present disclosure is not limited thereto. Specifically, the first gate structure 310 of the select transistor 300 can include a gate electrode 311 and a spacer 312. The spacer 312 surrounds the gate electrode 311, and can be formed by a single-layer structure or a multi-layer structure. The drain region 320 and the source region 330 are aligned with the spacer 312 on two opposite sides of the gate electrode 311. The second gate structure 510 of the memory transistor 500 can include a gate electrode 511 and a spacer 512, whose structure and configuration are the same as the gate electrode 311 and the spacer 312 of the select transistor 300, and not described again herein. It should be noted that the first electrode region 520 and the second electrode region 530 in the first embodiment are a drain region and a source region of a transistor, respectively; in other embodiments, the first electrode region and the second electrode region can also be the source region and the drain region of the transistor, respectively.

Further, the high density embedded-artificial synaptic element 100 can further include a first contact 410 and a second contact 420. The first contact 410 is electrically connected between the metal layer 400 and the drain region 320 of the select transistor 300. The second contact 420 is electrically connected between the metal layer 400 and the gate electrode 511 of the second gate structure 510 of the memory transistor 500. It is worth noting that the first contact 410 has a length $L_1$, the second contact 420 has a length $L_2$, and the length $L_1$ is greater than the length $L_2$. Moreover, the high density embedded-artificial synaptic element 100 can further include a Shallow Trench Isolation (STI) region 600. The STI region 600 is disposed on the semiconductor substrate 200 and located between the drain region 320 of the select transistor 300 and the first electrode region 520 of the memory transistor 500. The STI region 600 is formed by removing a portion of the semiconductor substrate 200 to form a trench in the semiconductor substrate 200, and the aforementioned trench is filled with a dielectric material. The dielectric material can be silicon oxide, silicon nitride, silicon oxynitride, carbon-doped silicon oxide, or other STI materials. The STI region 600 is mainly configured to separate the active region between the select transistor 300 and the memory transistor 500.

Figure 3:
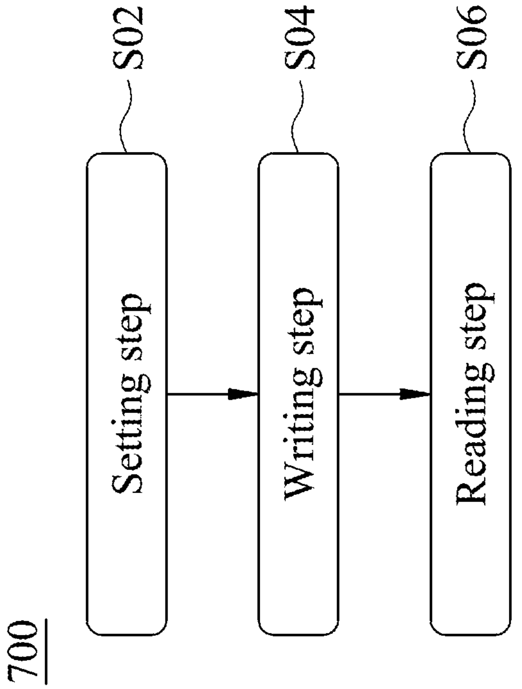
FIG. 3 shows a flow chart of an operating method of the high density embedded-artificial synaptic element according to a second embodiment of the present disclosure.

Please refer to FIGS. 1, 2 and 3. FIG. 3 shows a flow chart of an operating method 700 of the high density embedded-artificial synaptic element 100 according to a second embodiment of the present disclosure. As shown in FIG. 3, the operating method 700 of the high density embedded-artificial synaptic element 100 can be applied to the high density embedded-artificial synaptic element 100 of FIG. 2, and includes performing the setting step S02, the writing step S04 and the reading step S06. The following Table 1 lists each voltage applied to each terminal of the high density embedded-artificial synaptic element 100 in the setting step S02, the writing step S04 and the reading step S06 of the operating method 700 of the high density embedded-artificial synaptic element 100, and the operating method 700 of the high density embedded-artificial synaptic element 100 of the present disclosure is described in more detail with the drawings and the embodiments below.

TABLE 1

| | Set | Write (X = 1) | Write (X = 0) | Read |
|---|---|---|---|---|
| the source region 330 | 0 V | 0 V | 0 V | Floating |
| the gate electrode 311 | 0.5 V | 1 V | 1 V | Floating |
| the first electrode region 520 | 4 V | 0 V | 2 V | 1 V |
| the second electrode region 530 | 4 V | 2 V | 0 V | 0 V |

Figure 4A:
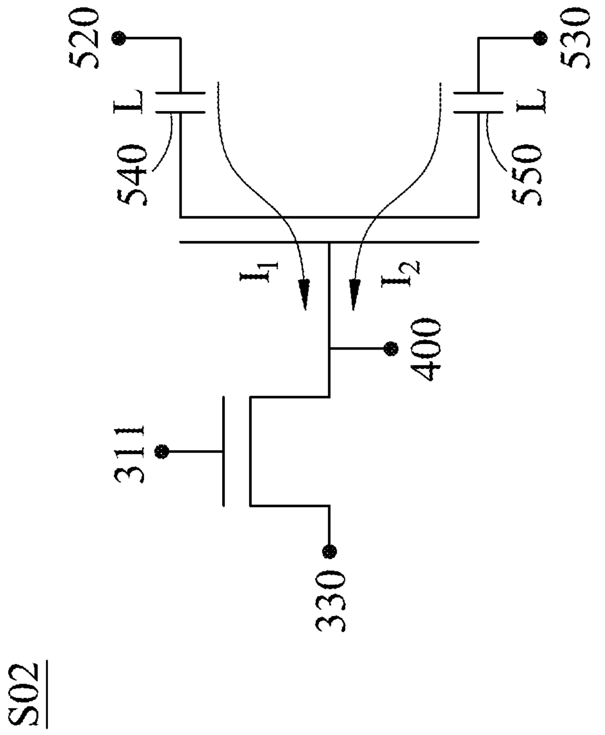
FIG. 4A shows a schematic view of a setting step of the operating method of the high density embedded-artificial synaptic element of FIG. 3.
Figure 4B:
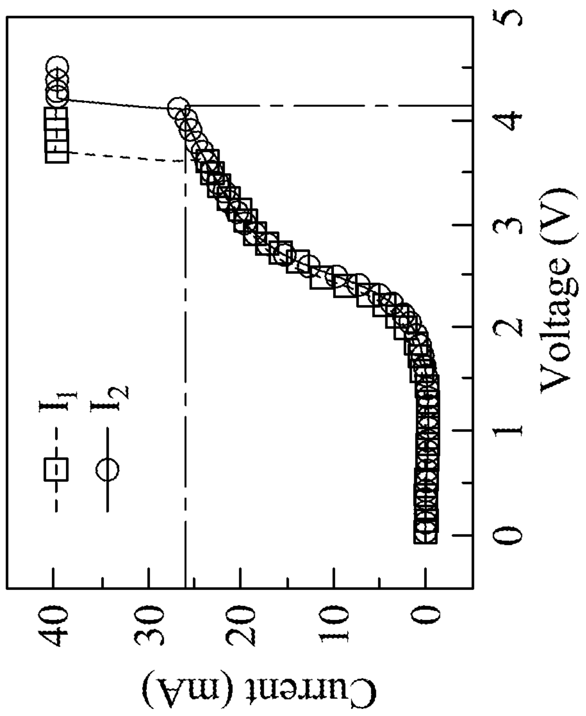
FIG. 4B shows a curve diagram of an initial current flowing through a first memristor and an initial current flowing through a second memristor of the setting step of FIG. 4A.

Please refer to FIGS. 3, 4A and 4B. FIG. 4A shows a schematic view of the setting step S02 of the operating method 700 of the high density embedded-artificial synaptic element 100 of FIG. 3. FIG. 4B shows a curve diagram of an initial current $I_1$ flowing through the first memristor 540 and an initial current $I_2$ flowing through the second memristor 550 of the setting step S02 of FIG. 4A. As shown in FIG. 4A, the setting step S02 is performed to apply an initial voltage to the first electrode region 520 and the second electrode region 530 to set the first memristor 540 and the second memristor 550 in a low resistive state L. In detail, the high density embedded-artificial synaptic element 100 needs to apply a high voltage to the terminals of the first electrode region 520 and the second electrode region 530 before performing the resistive switching, so that the first memristor 540 and the second memristor 550 are initially set and are in the low resistive state L (i.e., a low resistance). The initial voltage in the setting step S02 is the aforementioned the high voltage, which can be 4 V, but the present disclosure is not limited thereto. In addition, it can be seen from the equivalent circuit diagram in FIG. 4A and the curve diagram in FIG. 4B that in response to determining that both the first memristor 540 and the second memristor 550 are in the low resistive state L, the initial current $I_1$ flowing through the first memristor 540 is close to the initial current $I_2$ flowing through the second memristor 550, which represents that the symmetry between the first memristor 540 and the second memristor 550 of the present disclosure is high.

Figure 4C:
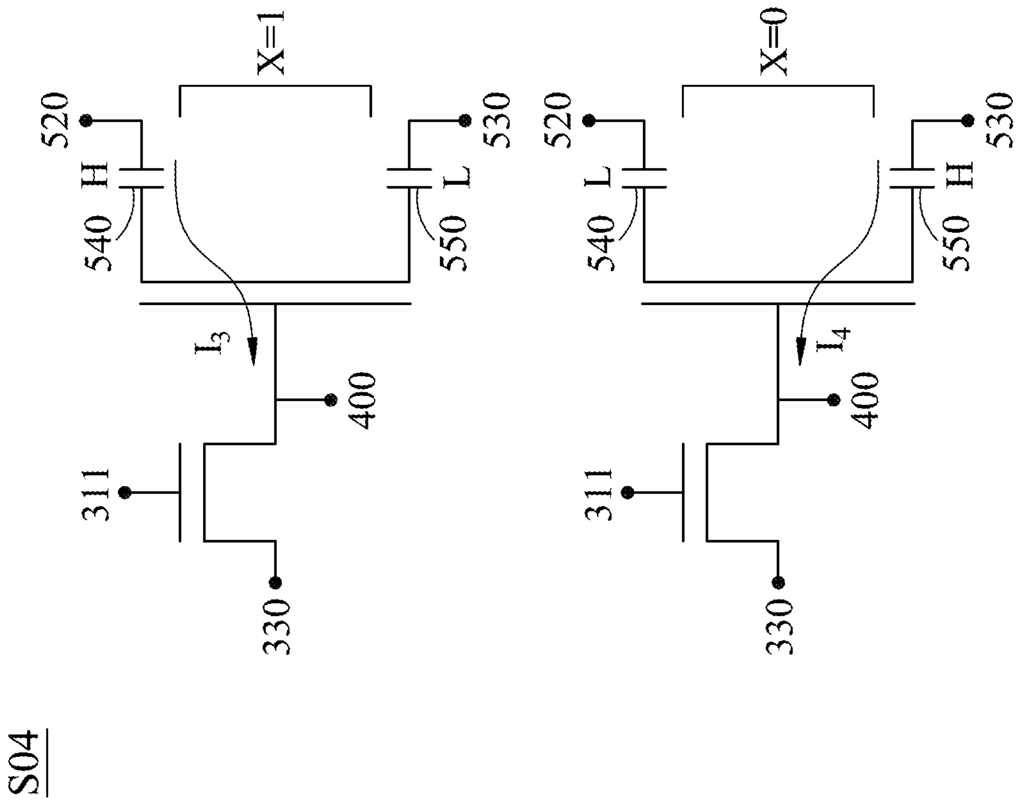
FIG. 4C shows a schematic view of a writing step of the operating method of the high density embedded-artificial synaptic element of FIG. 3.
Figure 4D:
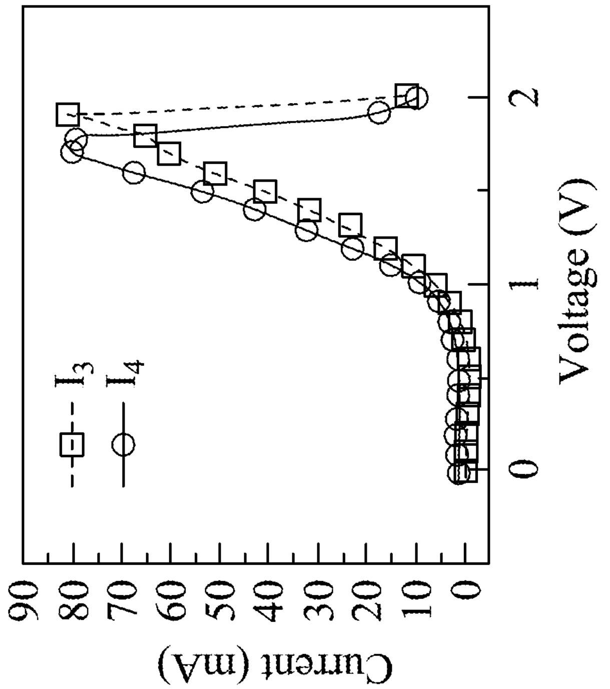
FIG. 4D shows a curve diagram of a reset current flowing through the first memristor and a reset current flowing through the second memristor in a high resistive state of the writing step of FIG. 4C.

Please refer to FIGS. 3, 4C and 4D. FIG. 4C shows a schematic view of the writing step S04 of the operating method 700 of the high density embedded-artificial synaptic element 100 of FIG. 3. FIG. 4D shows a curve diagram of a reset current $I_3$ flowing through the first memristor 540 and a reset current $I_4$ flowing through the second memristor 550 in a high resistive state H of the writing step of FIG. 4C. As shown in FIG. 4C, the writing step S04 is performed to apply a write voltage to one of the first electrode region 520 and the second electrode region 530 to reset one of the first memristor 540 and the second memristor 550 to the high resistive state H. Especially, the current resistive state of the first memristor 540 and the current resistive state of the second memristor 550 correspond to a write bit X. In response to determining that the first memristor 540 is in the high resistive state H and the second memristor 550 is in the low resistive state L, the write bit X can be 1 (i.e., X=1 in FIG. 4C). In response to determining that the first memristor 540 is in the low resistive state L and the second memristor 550 is in the high resistive state H, the write bit can be 0 (i.e., X=0 in FIG. 4C).

In detail, the present disclosure applies a low voltage to the first electrode region 520 to reset the first memristor 540 from the low resistive state L of FIG. 4A to the high resistive state H (i.e., a high resistance) of FIG. 4C and simultaneously applies a high voltage to the second electrode region 530 to maintain the second memristor 550 in the low resistive state L, and the write bit X is defined as 1. On the contrary, the present disclosure applies the low voltage to the second electrode region 530 to reset the second memristor 550 from the low resistive state L of FIG. 4A to the high resistive state H of FIG. 4C and simultaneously applies the high voltage to the first electrode region 520 to maintain the first memristor 540 in the low resistive state L, and the write bit X is defined as 0. Hence, the high density embedded-artificial synaptic element 100 implements the operation of writing 1 or 0 in the NVM Latch through the aforementioned process. The write voltage in the writing step S04 is the aforementioned low voltage, which can be 0 V, and the aforementioned high voltage can be 2 V, but the present disclosure is not limited thereto. In addition, it can be seen from the equivalent circuit diagram in FIG. 4C and the curve diagram in FIG. 4D that in response to determining that the first memristor 540 and the second memristor 550 are in the complementary resistive state, the reset current $I_3$ flowing through the first memristor 540 is close to the reset current $I_4$ flowing through the second memristor 550, which represents that the first memristor 540 and the second memristor 550 of the present disclosure still maintain low variability after the operation of the resistive switching.

Figure 4E:
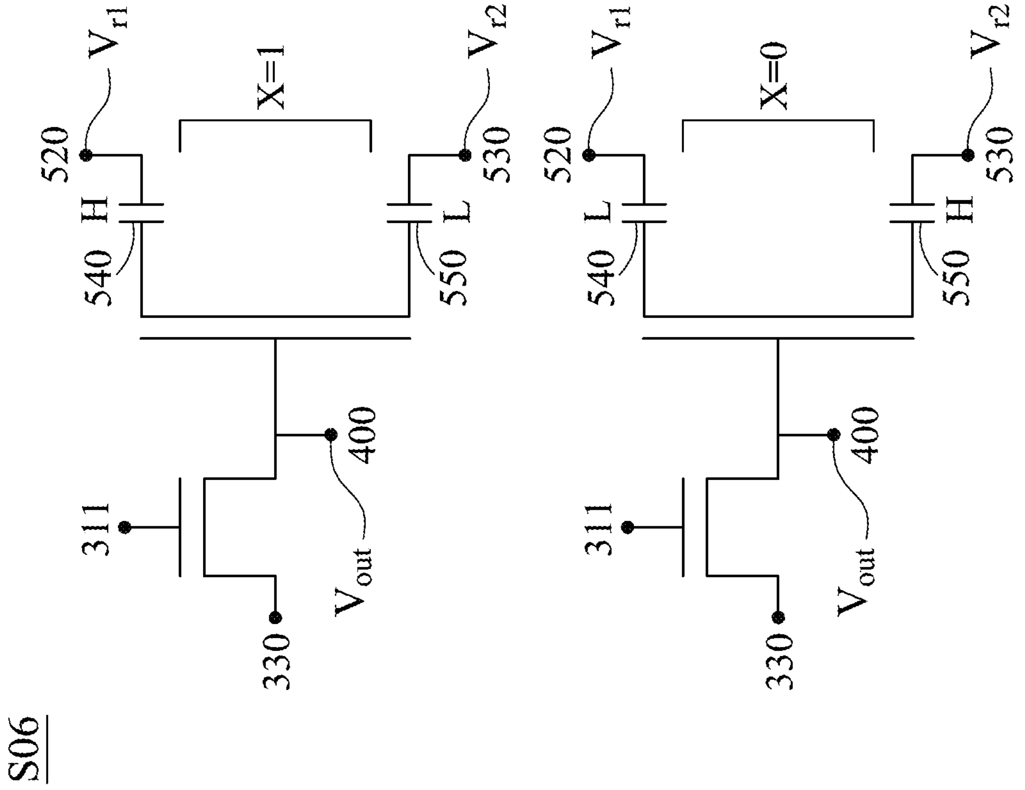
FIG. 4E shows a schematic view of a reading step of the operating method of the high density embedded-artificial synaptic element of FIG. 3.
Figure 4F:
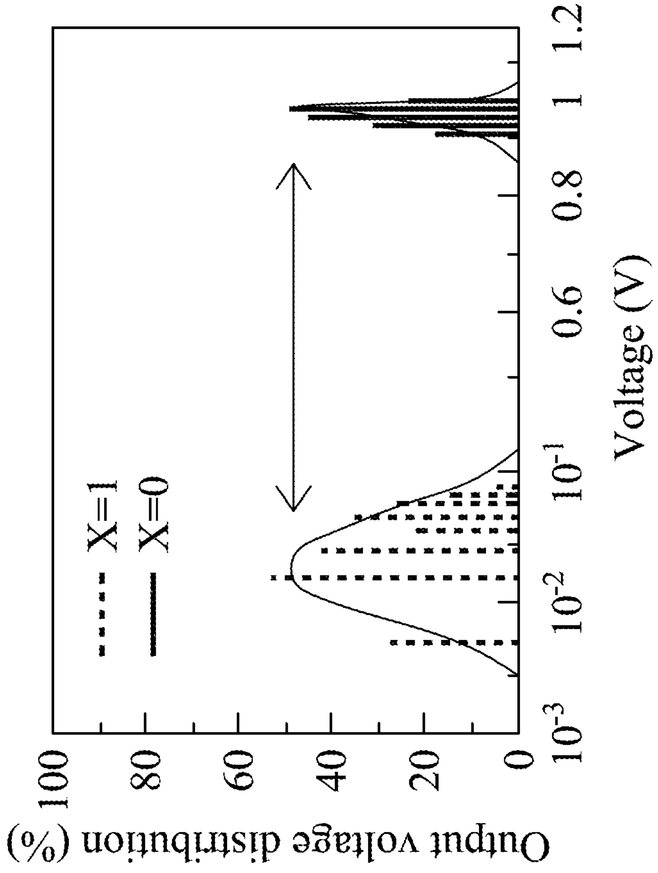
FIG. 4F shows an output voltage distribution diagram drawn by measuring a plurality of the high density embedded-artificial synaptic elements operating at multiple different write bits.

Please refer to FIGS. 3, 4E and 4F. FIG. 4E shows a schematic view of the reading step S06 of the operating method 700 of the high density embedded-artificial synaptic element 100 of FIG. 3. FIG. 4F shows an output voltage distribution diagram drawn by measuring a plurality of the high density embedded-artificial synaptic elements 100 operating at multiple different write bits X. As shown in FIG. 4E, the reading step S06 is performed to float the gate electrode 311 of the select transistor 300, apply a read voltage $V_{r1}$ to the first electrode region 520, and apply another read voltage $V_{r2}$ to the second electrode region 530, and then an output voltage $V_{out}$ of the metal layer 400 is captured, and the output voltage $V_{out}$ is determined according to the write bit X. The read voltage $V_{r1}$ is greater than the read voltage $V_{r2}$. In response to determining that the write bit X is 1, the output voltage $V_{out}$ can approach the read voltage $V_{r2}$ (i.e., 0 V in Table 1). In response to determining that the write bit X is 0, the output voltage $V_{out}$ can approach the read voltage $V_{r1}$ (i.e., 1 V in Table 1).

In detail, the high density embedded-artificial synaptic element 100 continues to perform the read operation after the writing operation is completed. In the reading step S06, the select transistor 300 is turned off, and the read voltage $V_{r1}$ is applied to the terminal of the first electrode region 520, and the read voltage $V_{r2}$ is applied to the terminal of the second electrode region 530 or grounding the terminal of the second electrode region 530. In a Voltage Divider Rule, the output voltage $V_{out}$ is a divided voltage between the upper and lower terminals. Hence, in response to determining that the first memristor 540 is in the high resistive state H and the second memristor 550 is in the low resistive state L (i.e., the write bit X is 1), the output voltage $V_{out}$ approaches 0 V. In response to determining that the first memristor 540 is in the low resistive state L and the second memristor 550 is in the high resistive state H (i.e., the write bit X is 0), the output voltage $V_{out}$ approaches 1 V. In addition, it can be seen from the equivalent circuit diagram in FIG. 4E and the output voltage distribution diagram drawn by measuring the high density embedded-artificial synaptic elements 100 in FIG. 4F that there is a cell variation between the first memristor 540 and the second memristor 550, so that the output voltage $V_{out}$ has a distribution interval; nevertheless, the output result still has a read window that is more than ten times larger. Therefore, the operating method 700 of the high density embedded-artificial synaptic element 100 of the present disclosure implements the logic gates of the NVM Latch by switching the high resistive state H and the low resistive state L of the first memristor 540, and switching the high resistive state H and the low resistive state L of the second memristor 550. The operating method 700 of the high density embedded-artificial synaptic element 100 of the present disclosure can also determine the divided output voltage $V_{out}$ by the write bit X. Compared with the conventional digital switching method, the CIM of the present disclosure has the advantages of more stable output and higher efficient in the power consumption. Further, the state distribution of the output has a good read window even under the influence of the variation of manufacturing process and component.

Figure 5:
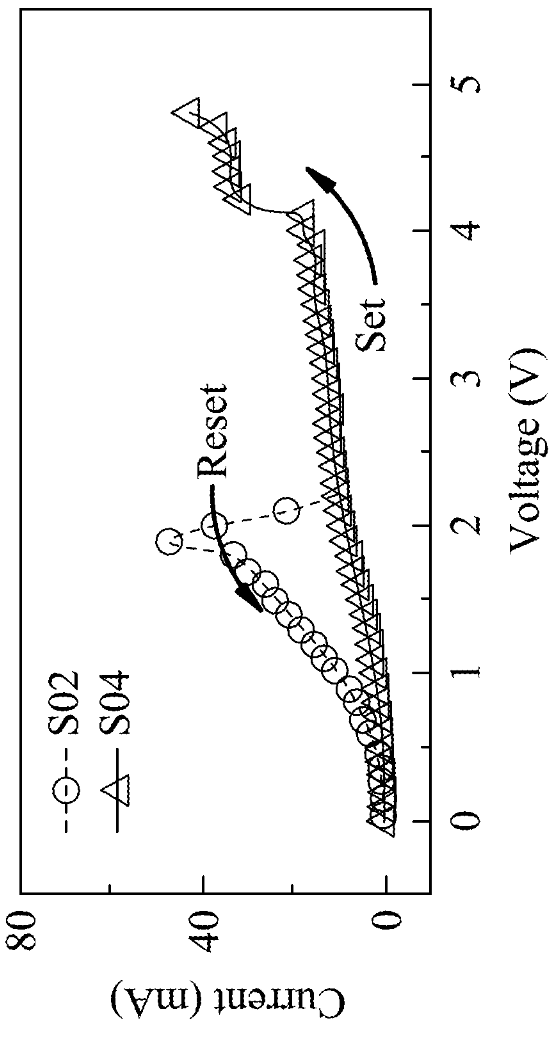
FIG. 5 shows a schematic view of a DC switching characteristic of a first electrode region of the high density embedded-artificial synaptic element of the present disclosure.

Please refer to FIGS. 3, 4A, 4C and 5. FIG. 5 shows a schematic view of a DC switching characteristic of the first electrode region 520 of the high density embedded-artificial synaptic element 100 of the present disclosure. Specifically, the horizontal axis of FIG. 5 represents a voltage applied to the first electrode region 520, and the vertical axis represents a current flowing through the first memristor 540. In the setting step S02, the first memristor 540 is initialized by applying the high voltage, and the first memristor 540 is set in the low resistive state L, and the initial current $I_1$ jumps to be a high current instantaneously. In the writing step S04, the first memristor 540 is reset to the high resistive state H by applying the low voltage, and the reset current $I_3$ drops to be a low current instantaneously. It is worth noting that there is a clear voltage interval between the high voltage applied for setting and the low voltage applied for resetting; thus, compared with the conventional synaptic element, the high density embedded-artificial synaptic element 100 of the present disclosure has a larger operation window so as to avoid over-write.

Figure 6:
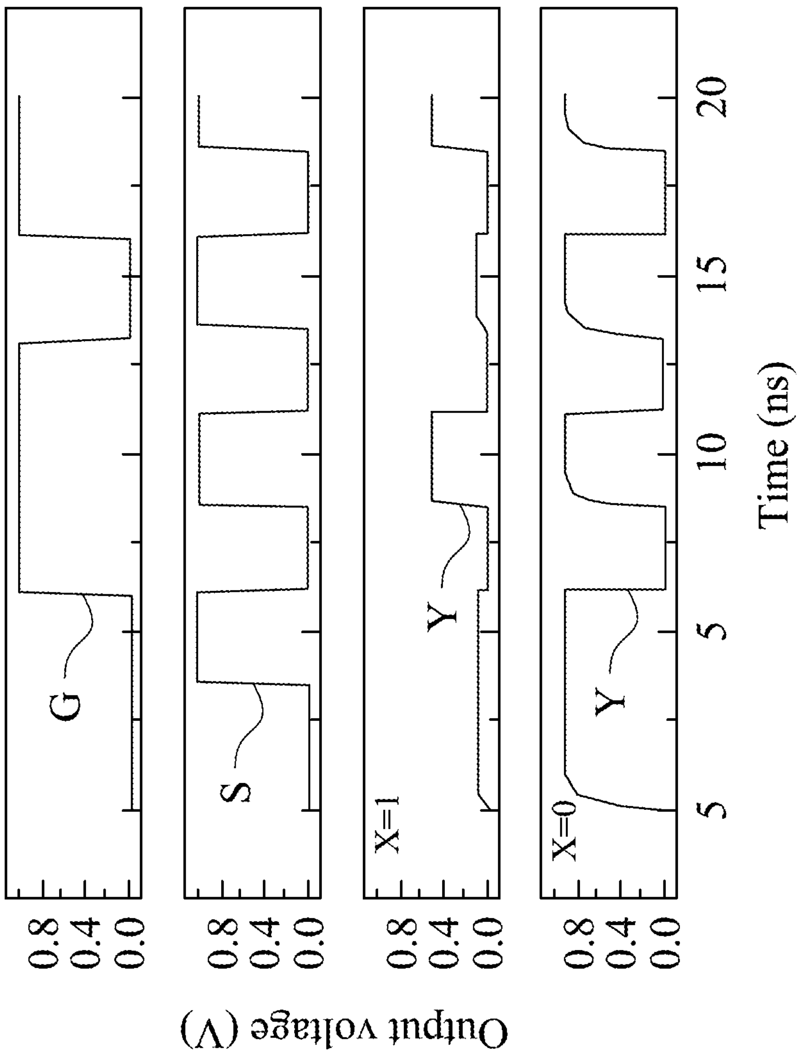
FIG. 6 shows an input/output timing chart of a non-volatile memory latch formed by the high density embedded-artificial synaptic element of the present disclosure.

Please refer to FIGS. 3, 4E and 6. FIG. 6 shows an input/output timing chart of the NVM Latch formed by the high density embedded-artificial synaptic element 100 of the present disclosure. As shown in FIG. 6, the output voltage $V_{out}$ corresponds to an output bit, and the output bit is represented as Y. A gate bit corresponding to the gate electrode 311 is represented as G. A source bit corresponding to the source region 330 of the select transistor 300 is represented as S. A first opposite bit corresponding to the gate bit G is represented as G'. A second opposite bit corresponding to the write bit X is represented as X', and the output bit Y satisfies the following condition: Y=GS+G'X'. For example, the select transistor 300 in the read step S06 is turned off, which represents that the input of the gate bit G is 0, the input of the first opposite bit G' is 1, and the source bit S can be negligible; thus, the output bit Y is equal to the second opposite bit X'.

Figure 7:
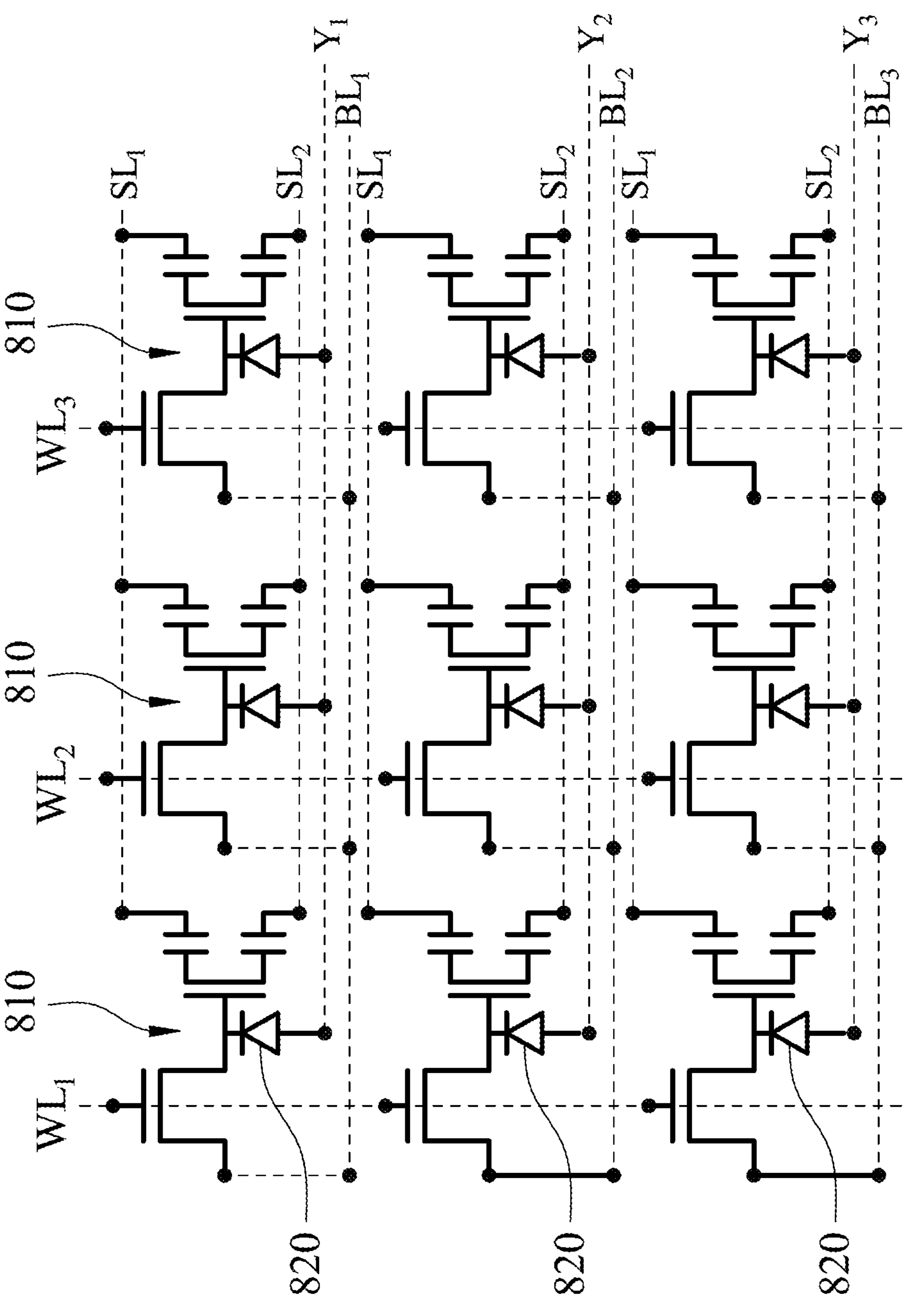
FIG. 7 shows an architecture schematic view of a neural network system according to a third embodiment of the present disclosure.

Please refer to FIG. 7. FIG. 7 shows an architecture schematic view of a neural network system 800 according to a third embodiment of the present disclosure. As shown in FIG. 7, the neural network system 800 includes a plurality of high density embedded-artificial synaptic elements 810 and a plurality of diodes 820.

In the third embodiment, the high density embedded-artificial synaptic elements 810 are arranged in a 3*3 array, but the present disclosure is not limited thereto. A metal layer of each of the high density embedded-artificial synaptic elements 810 generates an output voltage. A first gate structure of a select transistor of each of the high density embedded-artificial synaptic elements 810 arranged in one of columns is coupled to a word line $WL_1$. A first gate structure of a select transistor of each of the high density embedded-artificial synaptic elements 810 arranged in another one of columns is coupled to a word line $WL_2$. A first gate structure of a select transistor of each of the high density embedded-artificial synaptic elements 810 arranged in the last one of columns is coupled to a word line $WL_3$. A source region of a select transistor of each of the high density embedded-artificial synaptic elements 810 arranged in one of rows is coupled to a bit line $BL_1$. A source region of a select transistor of each of the high density embedded-artificial synaptic elements 810 arranged in another one of rows is coupled to a bit line $BL_2$. A source region of a select transistor of each of the high density embedded-artificial synaptic elements 810 arranged in the last one of rows is coupled to a bit line $BL_3$. A first electrode region of a memory transistor of each of the high density embedded-artificial synaptic elements 810 arranged in each of rows is coupled to a first electrode line $SL_1$. A second electrode region of a memory transistor of each of the high density embedded-artificial synaptic elements 810 arranged in each of rows is coupled to a second electrode line $SL_2$. Each of the diodes 820 is coupled to the two metal layers of each two of the high density embedded-artificial synaptic elements 810 adjacent to each other in a vertical direction. Each of the diodes 820 has an anode end. The anode ends of the diodes 820 arranged in one of rows are connected to each other and gather an output current $Y_1$. The anode ends of the diodes 820 arranged in another one of rows are connected to each other and gather an output current $Y_2$. The anode ends of the diodes 820 arranged in the last one of rows are connected to each other and gather an output current $Y_3$. Each of the diodes 820 determines whether to conduct or not according to the two output voltages of the two metal layers of each two of the high density embedded-artificial synaptic elements 810 adjacent to each other in the vertical direction.

Specifically, the present disclosure extends the high density embedded-artificial synaptic element 100 of the first embodiment to the 3*3 array to implement the neural network system 800 with stable CIM and low-power consumption. The conventional memristor neural network system stores the synaptic weights in the Multi-Level resistance Cell (MLC), and the current flowing through the memristor is determined by the resistive state of the memristor. Each of the memristors in the cross-point array is a synapse, and the summed element currents are similar to the vector dot product, and the system can exhibit an analog-additive operation when a specific bias is given to the system. However, the performance of the neural network system using the analog-additive memristors as the synapses is easily affected by the factors of tolerance, switching characteristics and linearity of the components themselves, which affect the accuracy of the aforementioned neural network system.

Different from the conventional cross-point array that controls the resistance of a single synaptic element as a weight, the neural network system 800 of the present disclosure utilizes the structure of the NVM Latch formed by the high density embedded-artificial synaptic elements 810 to combine the CIM with the neural network, and calculates the analog weights by multiplying the digital outputs of the resistive switching between the first memristor and the second memristor in the high density embedded-artificial synaptic elements 810. Each of the high density embedded-artificial synaptic elements 810 can be operated independently by the selection transistor without affecting each other.

The operation method of the neural network system 800 is mainly divided into two stages, which are a restored synaptic state and a synaptic state. The same as the aforementioned operating method 700 of the high density embedded-artificial synaptic element 100, in the restored synaptic state, the resistive states of the first memristor and the second memristor in the high density embedded-artificial synaptic element 810 are set or reset to opposite resistive states by applying two bias voltages to the first electrode line $SL_1$ and the second electrode line $SL_2$, so that the diode 820 determines whether to conduct or not according to the two output voltages adjacent to each other in the vertical direction. In response to determining that the output voltage of the high density embedded-artificial synaptic element 810 located on the upper end of the diode 820 is logic 0, and the output voltage of the high density embedded-artificial synaptic element 810 located on the lower end of the diode 820 is logic 1, the diode 820 is turned on. On the contrary, in response to determining that the output voltage of the high density embedded-artificial synaptic element 810 located on the upper end of the diode 820 is logic 1, and the output voltage of the high density embedded-artificial synaptic element 810 located on the lower end of the diode 820 is logic 0, the diode 820 is turned off. The value of the output current $Y_1$ gathered from the diodes 820 arranged in row is the result of the sum of the currents that the three different diodes 820 are turned on or off, and the output currents $Y_2$, $Y_3$ and so on.

In the synaptic state, the bias voltage applied to the second electrode line $SL_2$ can be 0 V, and then the output voltage of the high density embedded-artificial synaptic element 810 can be obtained by adjusting the bias voltage applied to the first electrode line $SL_1$ (the same as the reading step S06 in FIG. 4E); further, the breakover current of the diode 820 is changed, and more weight combinations are obtained to realize a more precise judgment. The following Table 2 lists each voltage applied to each terminal of the neural network system 800 by the operation method of the neural network system 800 in the restored synaptic state and the synaptic state.

TABLE 2

| | synaptic state bias condition | restored synaptic state: low resistive state to high resistive state | restored synaptic state: high resistive state to low resistive state |
|---|---|---|---|
| the word lines $WL_1$, $WL_2$, $WL_3$ | 0 V | 1 V | 0.5 V |
| the bit lines $BL_1$, $BL_2$, $BL_3$ | 0 V | 0 V | 0 V |
| the first electrode line $SL_1$ | 1 V to 2 V | 2.5 V | 5 V |
| the second electrode line $SL_2$ | 0 V | 0 V | 0 V |

Figure 8:
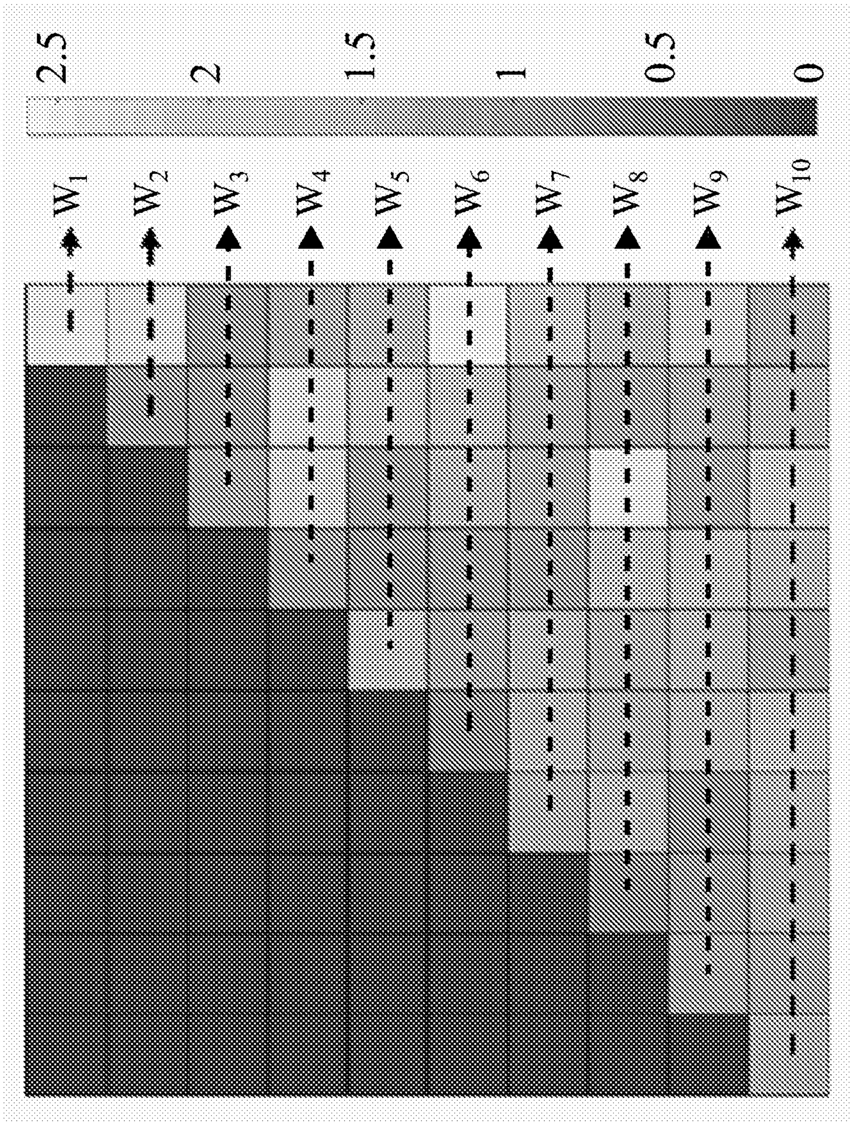
FIG. 8 shows a bitmap of a plurality of weights and a plurality of output currents of a neural network system according to a fourth embodiment of the present disclosure.

Please refer to FIG. 8. FIG. 8 shows a bitmap of a plurality of weights $W_1$, $W_2$, $W_3$, $W_4$, $W_5$, $W_6$, $W_7$, $W_8$, $W_9$, $W_{10}$ and a plurality of output currents of a neural network system according to a fourth embodiment of the present disclosure. Specifically, the neural network system of the fourth embodiment is a 10*10 array formed by extending the neural network system 800 of the third embodiment. As shown in FIG. 8, the output currents of the high density embedded-artificial synaptic elements 810 from large to small exhibit a distribution from light to dark. In the first row, only one diode is turned on, and the weight is defined as $W_1$. In the second row, two diodes are turned on, the weight is defined as $W_2$, and so on. The weight $W_{10}$ represents that the breakover currents of ten diodes are accumulated, and have the largest weight in the 10*10 array. Therefore, the neural network system 800 of the present disclosure only needs to apply the bias voltage to the first electrode line $SL_1$ and the second electrode line $SL_2$ when updating the high density embedded-artificial synaptic element 810, so that the first memristor and the second memristor can be set in opposite resistive states, and the conduction of the diode 820 is determined according to the two output voltages of the two high density embedded-artificial synaptic elements 810 adjacent to each other in the vertical direction. Hence, the neural network system 800 of the present disclosure does not require complicated operations and reduces power consumption effectively. In addition, the neural network system 800 can obtain the output voltages of the high density embedded-artificial synaptic elements 810 by adjusting the bias voltage; further, the output current of the diode 820 is changed, and more weight combinations are obtained.

In summary, the present disclosure has the following advantages. First, the present disclosure utilizes the metal layer to connect the drain region of the select transistor to the second gate structure of the memory transistor, besides it can utilize the characteristics of the complementary resistive states of the first memristor and the second memristor in the memory transistor to operate the twin bits in the high resistive state and the low resistive state, respectively, and form the structure of the NVM Latch. Second, the data output characteristic of the high density embedded-artificial synaptic element of the present disclosure is more stable and higher efficient than the analogy access used by the conventional logic gates. In addition, the high density embedded-artificial synaptic element of the present disclosure can achieve the data density of the twin bits on a single transistor, which is more in line with the high data density requirements of the CIM. Third, the high density embedded-artificial synaptic element of the present disclosure still has a good reading window in the state distribution of the output even under the influence of the variation of manufacturing process and component.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A high density embedded-artificial synaptic element, comprising:

a semiconductor substrate;

a select transistor disposed on the semiconductor substrate and comprising a first gate structure, a drain region and a source region, wherein the drain region and the source region are located on two opposite sides of the first gate structure, respectively;

a metal layer electrically connected to the drain region of the select transistor;

a memory transistor disposed on the semiconductor substrate and coplanar with the select transistor, wherein the memory transistor comprises a second gate structure, a first electrode region, a second electrode region, a first memristor and a second memristor, the second gate structure is electrically connected to the metal layer, the first memristor is formed between the second gate structure and the first electrode region, and the second memristor is formed between the second gate structure and the second electrode region;

a first contact connected between the metal layer and the drain region of the select transistor; and a second contact connected between the metal layer and the second gate structure of the memory transistor;

wherein a length of the first contact is greater than a length of the second contact.

2. The high density embedded-artificial synaptic element of claim 1, wherein the select transistor is a High-K Metal Gate (HKMG) N-type field effect transistor.

3. The high density embedded-artificial synaptic element of claim 1, wherein the first gate structure comprises:

a gate electrode; and a spacer surrounding the gate electrode, wherein the drain region and the source region are aligned with the spacer on two opposite sides of the gate electrode.

4. The high density embedded-artificial synaptic element of claim 1, further comprising:

a shallow trench isolation region disposed on the semiconductor substrate and located between the drain region of the select transistor and the first electrode region of the memory transistor.

5. A neural network system, comprising:

a plurality of the high density embedded-artificial synaptic elements of claim 1 arranged in array, wherein the metal layer of each of the high density embedded-artificial synaptic elements generates an output voltage, the first gate structure of the select transistor of each of the high density embedded-artificial synaptic elements arranged in column is coupled to a word line, the source region of the select transistor of each of the high density embedded-artificial synaptic elements arranged in row is coupled to a bit line, the first electrode region of the memory transistor of each of the high density embedded-artificial synaptic elements arranged in row is coupled to a first electrode line, and the second electrode region of the memory transistor of each of the high density embedded-artificial synaptic elements arranged in row is coupled to a second electrode line; and a plurality of diodes, wherein each of the diodes is coupled to the two metal layers of each two of the high density embedded-artificial synaptic elements adjacent to each other in a vertical direction, each of the diodes has an anode end, and the anode ends of the diodes arranged in row are connected to each other and gather an output current;

wherein each of the diodes determines whether to conduct or not according to the two output voltages of the two metal layers of each two of the high density embedded-artificial synaptic elements adjacent to each other in the vertical direction.

* * * * *